(12) United States Patent
Hernandez et al.

(10) Patent No.: US 9,857,397 B2
(45) Date of Patent: Jan. 2, 2018

(54) MODULAR PACKAGING WITH ELEVATING SCREW

(71) Applicant: Sensata Technologies, Inc., Attleboro, MA (US)

(72) Inventors: Oscar Rivera Hernandez, Tijuana (MX); Mariela Reynoso Castillo, Tijuana (MX); Ismael Favela Duran, Playas de Rosarito (MX)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 15/093,436

(22) Filed: Apr. 7, 2016

(65) Prior Publication Data
US 2017/0295653 A1    Oct. 12, 2017

(51) Int. Cl.
| | |
|---|---|
| *H05K 7/00* | (2006.01) |
| *G01R 19/00* | (2006.01) |
| *H05K 1/14* | (2006.01) |
| *G01R 31/327* | (2006.01) |
| *F16B 35/04* | (2006.01) |
| *H01R 4/44* | (2006.01) |
| *H01H 50/02* | (2006.01) |
| *H01H 50/14* | (2006.01) |

(52) U.S. Cl.
CPC ........ *G01R 19/0084* (2013.01); *F16B 35/041* (2013.01); *G01R 31/3278* (2013.01); *H01R 4/44* (2013.01); *H05K 1/14* (2013.01); *H01H 50/02* (2013.01); *H01H 50/14* (2013.01)

(58) Field of Classification Search
CPC .... H05K 5/0008; H05K 1/14; G01R 19/0084; G01R 31/3278

USPC ......................................................... 361/819
See application file for complete search history.

(56) References Cited

U.S. PATENT DOCUMENTS

| | | | | |
|---|---|---|---|---|
| 3,414,866 | A | * | 12/1968 | Norden .................... H01R 4/34 439/586 |
| 3,714,515 | A | | 1/1973 | Lee |
| 4,172,272 | A | | 10/1979 | Schneider |
| 4,361,371 | A | | 11/1982 | Williams |
| 4,620,263 | A | | 10/1986 | Ito |

(Continued)

FOREIGN PATENT DOCUMENTS

| | | |
|---|---|---|
| DE | 1005077 | 10/2000 |
| EP | 0631463 A2 | 12/1994 |

(Continued)

OTHER PUBLICATIONS

Carlo Gavazzi Automation Components, Contracts, Overloads and Manual Motor Starters, Contractor Brochure CC Series, www.Gavazzi/Online.com, 24 pages, Retrieved from Internet Sep. 17, 2015.

(Continued)

*Primary Examiner* — Hung S Bui
(74) *Attorney, Agent, or Firm* — Banner & Witcoff, Ltd.

(57) ABSTRACT

Modular packaging includes a solid state relay and a function module, wherein the function module comprises a housing containing a printed circuit board and an elevating screw. The elevating screw comprises a first end with an external threading and a second end with an external threading, where the elevating screw may be selectively altered between a first position and a second position within the housing. Related embodiments are disclosed.

20 Claims, 10 Drawing Sheets

(56) References Cited

U.S. PATENT DOCUMENTS

| | | | |
|---|---|---|---|
| 4,929,932 A * | 5/1990 | Shipkowski | G01R 31/024 307/112 |
| 5,018,050 A | 5/1991 | Maenishi et al. | |
| 5,510,960 A | 4/1996 | Rosen | |
| 5,653,614 A * | 8/1997 | Eschermann | F16B 41/002 411/412 |
| 5,857,874 A | 1/1999 | Takeuchi | |
| 6,379,196 B1 | 4/2002 | Greenberg et al. | |
| 6,891,705 B2 | 5/2005 | Bryan | |
| 6,955,544 B2 * | 10/2005 | Miquel | H05K 7/142 361/752 |
| 7,213,999 B2 * | 5/2007 | Haas | F16B 5/0275 403/337 |
| 7,304,828 B1 | 12/2007 | Shvartsman | |
| 7,559,810 B1 | 7/2009 | Wu | |
| 7,578,711 B2 | 8/2009 | Robinson | |
| 7,619,899 B2 * | 11/2009 | Rubenstein | H05K 1/141 361/740 |
| 8,027,164 B2 * | 9/2011 | Peck | H05K 7/142 361/730 |
| 8,157,603 B2 | 4/2012 | Trico | |
| 8,419,332 B2 * | 4/2013 | Kochheiser | F16B 5/0275 411/411 |
| 8,704,409 B2 | 4/2014 | Owens | |
| 9,267,522 B2 * | 2/2016 | Whipple | H02J 1/00 |
| 2007/0057076 A1 * | 3/2007 | Orozco | G05D 23/22 236/1 C |
| 2007/0173092 A1 * | 7/2007 | Von Arx | H01R 13/514 439/188 |
| 2012/0108107 A1 | 5/2012 | Chen et al. | |
| 2015/0057822 A1 | 2/2015 | Baldridge | |

FOREIGN PATENT DOCUMENTS

| | | |
|---|---|---|
| EP | 1071212 A1 | 1/2001 |
| EP | 2028721 A2 | 2/2009 |
| JP | 2001060859 A | 3/2001 |

OTHER PUBLICATIONS

Crouzet Catalog 1, 112 pages, Retrieved from Internet Sep. 17, 2015.
Crouzet SSR—GN Series IP20 Solid State Relays, http://www.crouzet-ssr.com/english/products/_gnip20.shtml, 5 pages, Sep. 23, 2015.
Dinkle Products, Pluggable terminal blocks, PCB terminal blocks, Din rail terminal blocks, Barrier terminal blocks, Screwless terminal blocks, Panel mount terminal . . . , 2 pages, Sep. 17, 2015.
CST Custom Sensors & Technologies, crydom®, Evolution Dual Solid State Relays, 8 pages, Mar. 2009.
OMRON Corporation, Soft-start/stop Solid State Contractors G3JT, , Soft-start/stop Function Starts and Stops Three-phase Motors Smoothly and Economically, 4 pages, © OMRON Corporation 2012.
State Motor & Control Solutions, Fumas Controls—Furnas Electric Controls: Motor Starters, Contractors, Overload Relays a . . . , http://www.furnas-controls.com, 7 pages, Sep. 17, 2015.
Teledyne Relays, Everywhereyoulook™, Solid-State Power Relays Selection Guide, www.teledynerelays.com, www.teledyne-europe.com, © 2013 Teledyne Relays, 24 pages.
Molex® Catalog, www.molex.com, 78 pages, Retrieved from Internet Sep. 17, 2015.
Molex®, Solderless Terminals, Terminal Blocks and Connectors, molex.com, 232 pages, Retrieved from Internet Sep. 17, 2015.
Crouzet Solid State Relays, GN Series Panel Mount Solid State Relays, www.crouzet.com, 2 pages, Retrieved from Internet Sep. 17, 2015.
Siemens, Product Details—Industry Mall—Siemens WW, https://mall.industry.siemens.com/mall/en/WW/Catalog/Product/3RF2020-1AA45, 1 page, Sep. 23, 2015.
Carlo Gavazzi, Solid State Relays, Industrial, 1-Phase ZS (IO) w. LED and Built-in Varistor Types RM 23, RM 40, RM 48, RM 60, Jun. 25, 2015, 10 pages.
Crydom®, The New Expanded range of S1 Generation 4 Panel Mount Solid State Relays, www.crydom.com, 2 pages, Retrieved from Internet Sep. 17, 2015.
Siemens Data sheet 3RF20 20-1AA45, Semiconductor Relay 3RF2, 1-PH. Width 45MM, 20A 48-600V / 4-30V DC Screw-Type Terminal Blocking Voltage 1200V, © Siemens AG, 5 pages, Sep. 23, 2015.
Carlo Gavazzi, Solid State Relays and Contactors, www.carlogavazzisales.com, 7 pages, Retrieved from Internet Sep. 17, 2015.
Schneider Electric, TeSys™ IEC Contractors and Starters Catalog, 60 pages,, www.schneider-electric.us, © 2012 Schneider Electric.
Sep. 19, 2017—(EP) Extended Search Report—App 17165436.1.
Anonymous "NOVA22—DIN Rail & Panel Mount Solid State Relays", www.crydom.com <http://www.crydom.com>, Mar. 15, 2016 (Mar. 15, 2016), XP002773292, Retrieved from the Internet: URL:https://web.archive.org/web/20160315190409/http:l/www.crydom.com/en/tech/brochures/crydom-nova22- brochure.pdf <http://www.crydom.com/en/tech/brochures/crydom-nova22- brochure.pdf> [retrieved on Aug. 29, 2017].

* cited by examiner

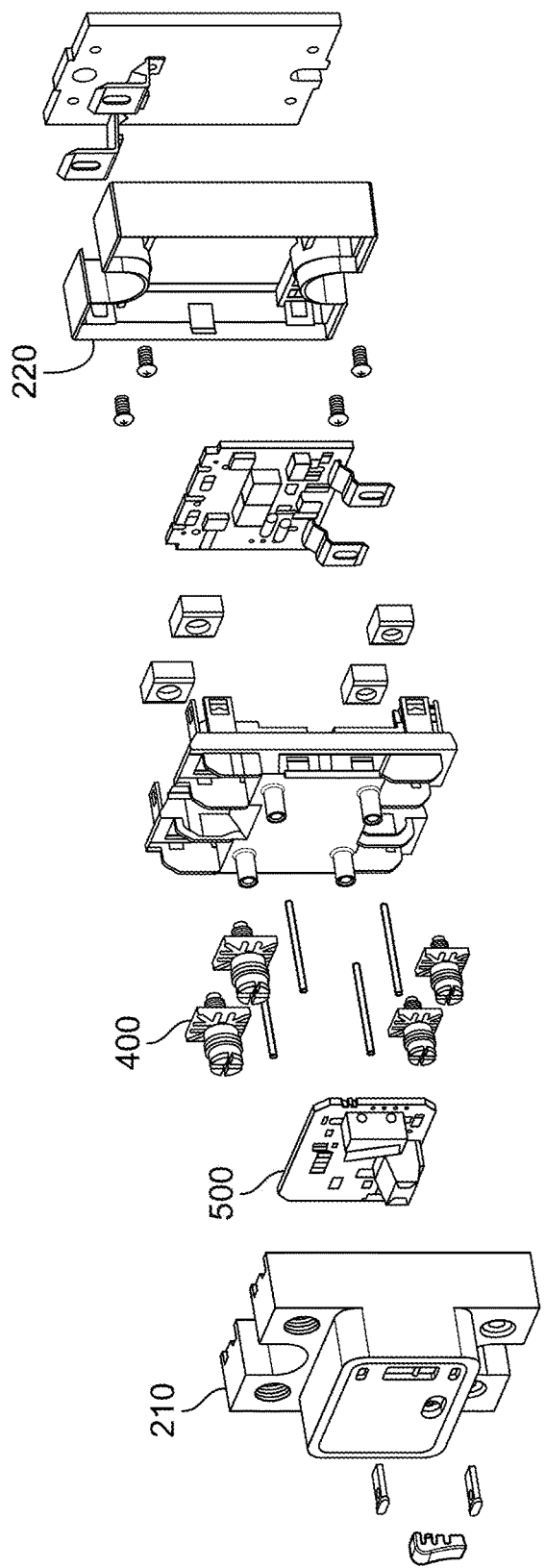

MODULAR PACKAGING WITH ELEVATING SCREW

TECHNICAL FIELD

This disclosure generally relates to a modular packaging apparatus, including for example, modular packaging units including a solid state relay and one or more function modules, such as one or more function modules interconnected through a terminal.

BACKGROUND

One difficulty in the modular packaging is the installation of cabling, including wiring and terminal insertion. Screws may be used to implement and secure wiring and terminal integration. However, the removal of these screws is necessary in order to remove or change the wiring and terminal combinations. Removing the screws requires the disconnection of the function module and solid state relay, and separation of the function module in order to fully remove the screw. These steps make the rewiring process cumbersome and tedious.

SUMMARY

This Summary provides an introduction to some general concepts relating to this disclosure in a simplified form that is further described below in the Detailed Description. This Summary is not intended to identify key features or essential features of the disclosure.

In some examples, a modular apparatus may generally include a function module and a solid state relay. In different examples the solid state relay may take different shapes, including generally rectangular dimensions, a hockey puck style relay, and other various shape and size combinations. In some examples the function module may be comprised of a plastic, resin, or plastic composite material. The function module may comprise a housing enclosing a printed circuit board and at least a first elevating screw. The function module may further define a bore and an aperture. The elevating screw may have a first end with a first diameter and a first external threading and a second end with a second diameter and a second external threading. The elevating screw may be selectively altered between a first position wherein the first end of the screw is the engaged within the aperture, and a second position wherein the second end of the screw is engaged within the bore.

In some examples, when the screw is engaged in a first position, it provides sufficient spacing between the end of the screw and the module so that cabling may be inserted into the aperture and installed without the need to disassemble the housing or disconnect the function module from the solid state relay. In some examples, this spacing will be sufficient such that at least a first terminal may be installed or replaced.

In some examples, a modular apparatus may generally include a solid state relay and at least one function module. The function module may generally include an exterior housing with a first portion and a second portion coupled with the first portion. The housing may enclose a first printed circuit board and at least a first elevating screw, and the elevating screw may have a first end and a second end. In some examples the first end may have a first threading with a first pitch distance and the second end may have a second threading with a second pitch distance. In certain examples the elevating screw may be configured to be selectively altered between a first position where the first end of the elevating screw is engaged with the first portion of the housing and a second position where the second end of the elevating screw is engaged with the second portion of the housing. In some examples, the first position of the elevating screw may provide sufficient spacing between the second end of the elevating screw and the housing for the installation or replacement of cabling.

In some examples the function module may include at least a first printed circuit board and a second printed circuit board. The function module may contain a sensing device capable of selectively establishing an electrical connection between the printed circuit boards. In some examples this device may be spring operated and capable of providing the electrical connection when pressure is applied to compress the spring.

In some examples, the function module may enclose a visual indicator and voltage recognition device. In certain examples, the voltage recognition device may receive an input range of voltages, and may determine if the actual voltage between the terminals of the solid state relay is within that input range. In some examples the function module may send a signal to the visual indicator that will cause the visual indicator to display a certain signal if the voltage is within the input range or a different signal if the voltage is not within the input range. In some examples the visual indicator will provide a display based on its receiving the signal. In certain examples the display with be a LED display, and may be a certain color depending on the signal received from the voltage recognition device.

BRIEF DESCRIPTION OF THE DRAWINGS

The present disclosure is illustrated by way of example and not limited in the accompanying figures in which like reference numerals indicate similar elements and in which:

FIG. 11 is a perspective view of another illustrative modular packaging with the components separated.

Further, it is to be understood that the drawings may represent the scale of different component of one single embodiment; however, the disclosed embodiments are not limited to that particular scale.

DETAILED DESCRIPTION OF EMBODIMENTS

The following description is not to be taken in a limiting sense, but is made merely for the purpose of describing exemplary embodiments. Reference throughout this specification to "one embodiment", "an embodiment", "some embodiments", "one form", "one example", "an example" or similar language means that a particular feature, structure, or characteristic described in connection with the embodiment is included in at least one embodiment of the present disclosure. Thus, appearances of the phrases "in one embodiment," "in an embodiment," "some embodiments", "in one form", "in another form", "in an example", "in one example", and similar language throughout this specification may refer to the same embodiment and/or may refer to separate or alternate embodiments as well. Furthermore, the described features, structures, or characteristics of the disclosure may be combined in any suitable manner in one or more embodiments.

In the following description of various examples of modular apparatuses, reference is made to the accompanying drawings, which form a part hereof, and in which are shown by way of illustration various example structures and environments in which aspects of the disclosure may be practiced. It is to be understood that other structures and environments may be utilized and that structural and functional modifications may be made from the specifically described structures and methods without departing from the scope of the present disclosure.

Figure 1:
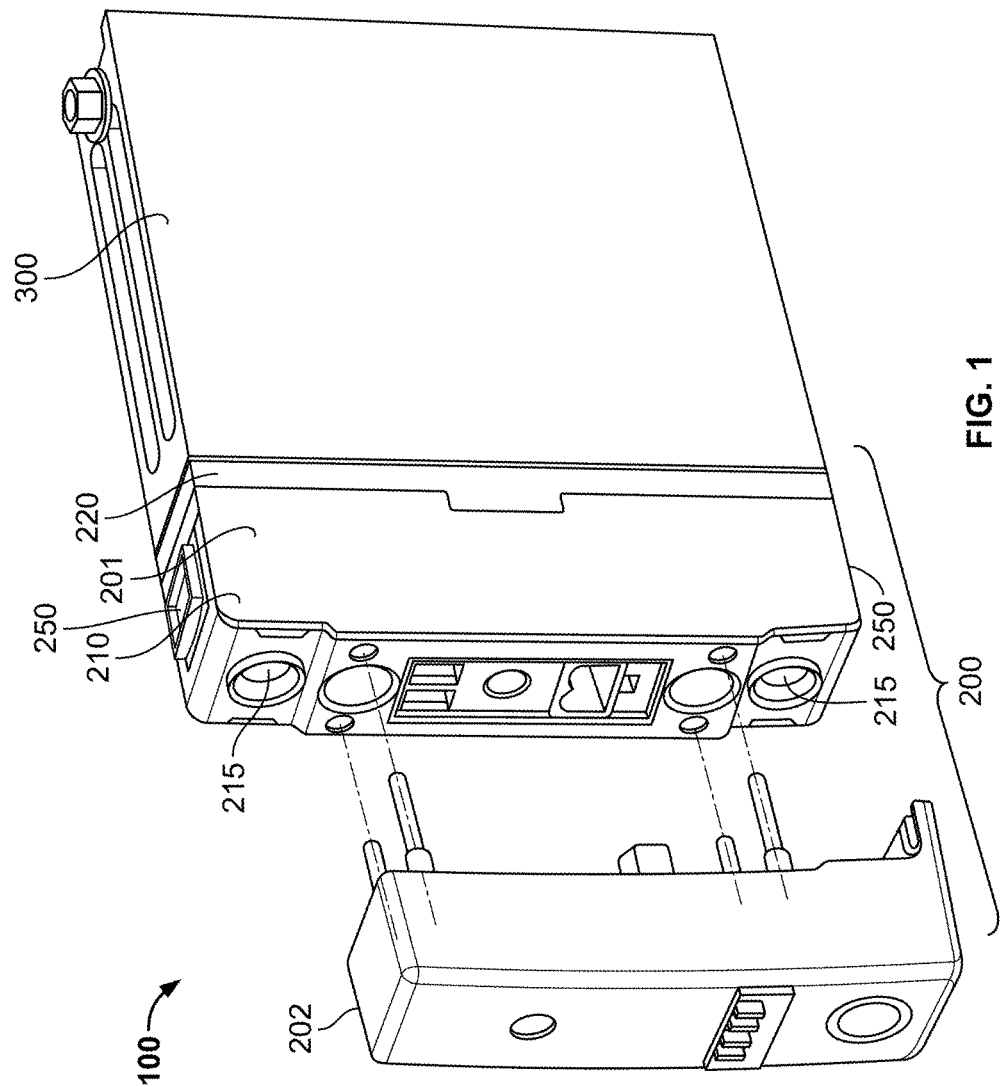
FIG. 1 is a perspective view of an illustrative modular packaging with the function module separated from the solid state relay.

FIG. 1 illustrates an example modular packaging apparatus 100, which includes a solid state relay 201 ("SSR"), a function module 202, and a thermal power dissipation unit 300 generally acting as a thermal heatsink device. The function module 202 may be removably coupled to the SSR 201 to create a function module coupled SSR 200. An SSR 201 may generally be defined by any size or shape. In different embodiments, an SSR 201 may generally be rectangular, circular, cylindrical, conical, or any other shape. In some examples, a width of the SSR 201 may be within a range including from about 10 mm to about 30 mm. For example, a width of an illustrative SSR 201 may be within 22.1 mm and 22.9 mm, with other widths being possible. In some embodiments the width may be greater than 20 mm, and in other embodiments the width may be less than 23 mm. Different embodiments may include different combinations of an SSR 201 with a certain size and shape and a function module 202 with a certain size and shape.

A function module 202 may generally be defined by any size or shape. In different embodiments, a function module 202 may generally be rectangular, circular, cylindrical, conical, or any other shape. A power dissipation unit 300 may be generally defined by any size or shape depending on the power output, shape, size, and/or other characteristics of the solid state relay.

Figure 2:
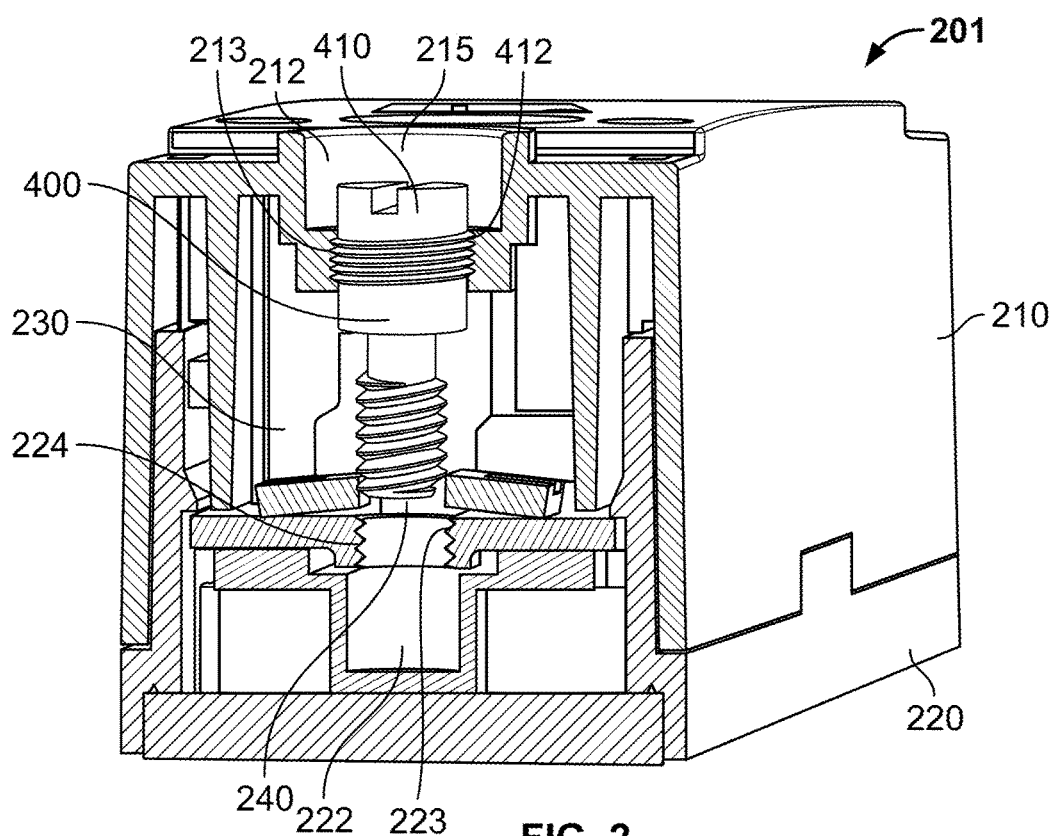
FIG. 2 is a side view of an illustrative solid state relay showing an elevating screw in a first position.

FIG. 2 illustrates an embodiment of an SSR 201 including a housing generally having a first portion 210 and a second portion 220. The first portion 210 may generally define a recess 230, which acts as an enclosed barrier. The SSR 201 may contain an elevating screw 400 which may be located within the housing and be at least partially contained in the recess 230. The SSR 201 may further contain at least a first printed circuit board 500, which may generally contain interconnected electronic components.

The function module 202 and SSR 201 may be removably coupled by a mechanical retention mechanism. In certain examples, the retention mechanism comprises corresponding structures and/or features on the function module 202 and the SSR 201 such as, for example, a correspondingly shaped and placed tab and groove (e.g. a tab on the function module and a corresponding groove, recess, or cavity on the SSR) that interact to fasten the function module 202 and the SSR 201 when these components are placed together. In certain examples, the retention mechanism includes one or more snaps, fasteners, threading, or hooks. The retaining mechanism is not limited to the illustrative examples in this disclosure and may include anything providing a removable connection between the function module 202 and the SSR 201.

Modular packaging may enhance or augment the capabilities of conventional solid state relays by providing additional control features. Differing combinations of function modules and solid state relays may provide unique benefits. These benefits may include operating range, maximum load currents, switching capabilities, and control voltage ranges. Further, function modules may provide unique monitoring and feedback information regarding the performance of the solid state relay. Changing the function module connected to a particular relay may allow a user to receive different information about the performance of that relay.

In some embodiments the function module 202 may provide a particular characteristic or attribute while in connection with the SSR 201. In different embodiments these characteristics or attributes provided by the function module may be different. In certain embodiments the removable coupling allows the function module 201 to be removed from the SSR 202. A user may then attach a different function module that provides relatively unique characteristics or attributes while connected to the SSR. This allows for the customization of the modular apparatus as different function modules may be connected and disconnected from a particular SSR, depending on the function attributes desired by the user or required by a particular application of the SSR. In certain embodiments SSRs may be mounted on a wall, stored in a cabinet, form part of an interlocking, etc. By being able to easily switch between function modules for a given SSR, a user may customize the modular apparatus for unique purposes. In certain embodiments the function module will monitor and capture information regarding the performance of the SSR. This information may be stored or displayed for a user to capture. In certain embodiments the information may be stored in different forms of memory, including ROM, Flash, RAM, etc.

In certain embodiments the first portion of the housing 210 and the second portion of the housing 220 may be removably coupled by a mechanical retaining mechanism, which may include snaps, fasteners, threading, or hooks. The retaining mechanism is not limited to the illustrative examples in this disclosure and may include anything providing a removable connection between the two portions. The retaining mechanism is not limited to these examples and could be anything providing a removable connection between the two portions. In other embodiments the first portion of the housing 210 and the second portion of the housing 220 may be coupled. In some cases, at least a portion of the housing 210 may be coupled (e.g., fastened, welded, etc.) to a different portion of the housing.

In functionality modules, it is important that the modules are properly sealed to reduce the risk of intrusion of solid objects. This includes the potential insertion of body parts, which may expose an individual to harmful electrocution. In certain embodiments, when the first portion of the housing 210 and the second portion of the housing 220 are coupled, and the function module 202 and the SSR 201 are coupled, the function module coupled SSR 200 will be fully sealed to meet one or more International Protection standards (e.g., an IP 20 standard, a National Electrical Manufacturers Association (NEMA) 1 standard, etc.). For example, the IP 20 standard represents protection against the insertion of objects greater than 12.5 mm, such as fingers or similar objects. In addition, designing function modules to an internationally recognized safety standard, such as the IP 20 standard, further provides safety benefits against electrocution by requiring overlaps in the plastic walls, therefore requiring energy to travel a creep distance to dissipate the energy before it could potentially electrocute a user. The insertion of elevating screws into a function module may improve product integrity that will aid in the sealing and compliance with IP standards.

Figure 5:
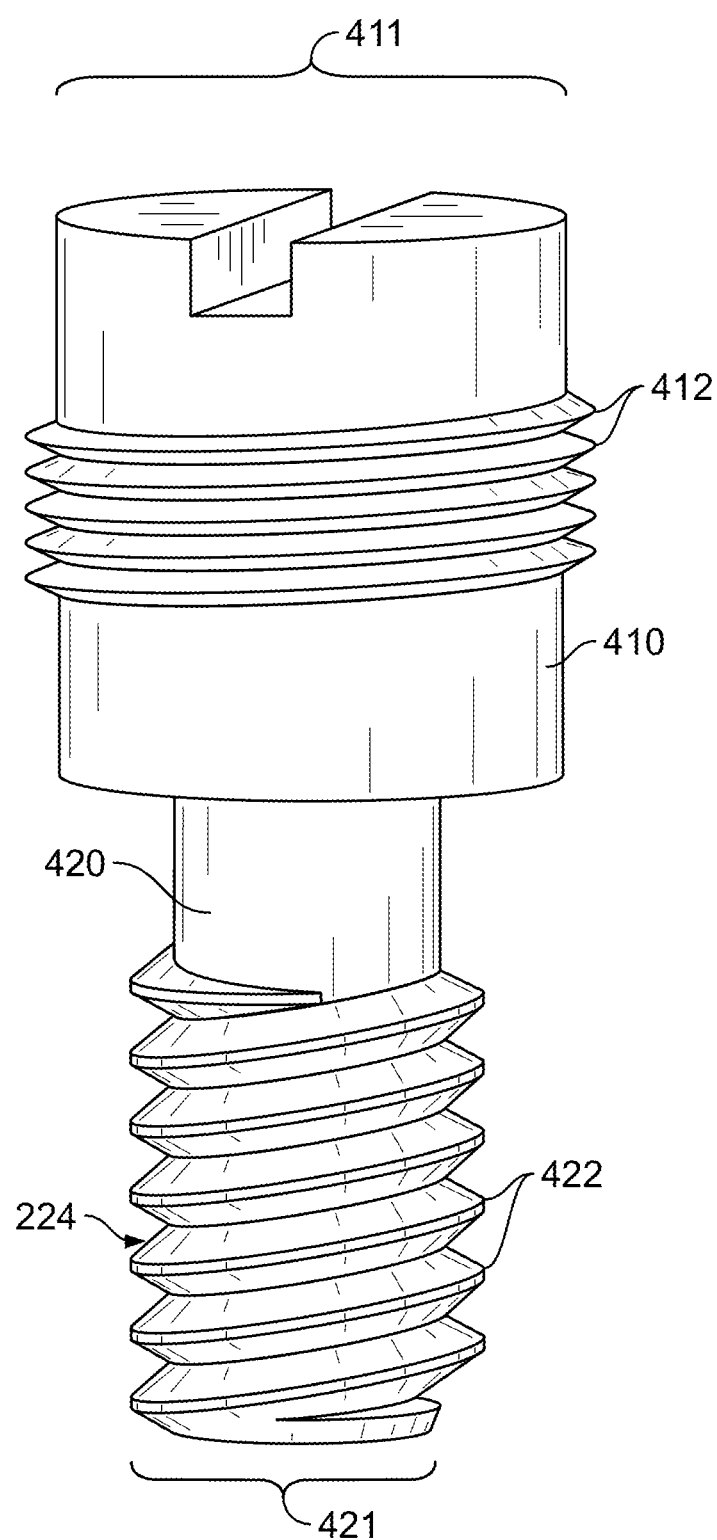
FIG. 5 is a side view of an illustrative elevating screw embodiment.

FIG. 5 illustrates an embodiment of an elevating screw 400. As shown, an elevating screw may have a first end 410 and a second end 420. The first end 410 may have a diameter 411 and an external threading 412. The external threading 412 will define a pitch distance and lead distance, as well as a major and minor diameter. In certain embodiments this external threading 410 may span the length of the first end 410. In other embodiments the external threading 412 may only span a portion of the first end 410. In further embodiments the external threading 412 may span a majority of the first end 410 of the screw 400. In different embodiments the external threading 412 may span a minority of the first end 410 of the screw 400. In different embodiments the external threading 412 may span half, a third, a fourth, a tenth, or another portion of the first end 410. In certain embodiments, the external threading 412 may be located at a top portion, a middle portion, or a bottom portion of the first end 410. In certain embodiments the external threading 412 may span multiple sections, or all sections, of first end 410. Different combinations of these characteristics could be used to provide differing physical attributes of the screw 400. In some embodiments the external threading 412 may be designed to an 8-32, 6-32, or ¼-48 Unified Thread Standard (UTS or UNC) standard. An 8-32 UNC standard would indicate a major diameter of 0.1640 inches, minor diameter of 0.1257 inches, and 32 threads per inch. A 6-32 UNC standard would indicate a major diameter of 0.1360 inches, 0.0997 inches, and 32 threads per inch. A ¼-48 standard would have a major diameter of 0.250 of an inch, minor diameter of 0.2062 inches, and 48 threads per inch.

The second end 420 may have a diameter 421 and an external threading 422. The external threading 422 will define a pitch distance and lead distance, as well as a major and minor diameter. In certain embodiments this external threading 422 may span the length of the second end 420. In other embodiments the external threading 422 may only span a portion of the second end 420. In further embodiments the external threading 422 may span a majority of the first end 420 of the screw 400. In different embodiments the external threading 422 may span a minority of the second end 420 of the screw 400. In different embodiments the external threading 422 may span half, a third, a fourth, a tenth, or another portion of the first end 420. In certain embodiments, the external threading 422 may be located at a top portion, a middle portion, or a bottom portion of the first end 420. In certain embodiments the external threading 422 may span multiple sections, or all sections, of first end 420. Different combinations of these characteristics could be used to provide differing physical attributes of the screw. In one embodiment the external threading 422 may be designed to an 8-32, 6-32, or ¼-48 UNC standard.

In differing embodiments the elevating screw 400 may be designed as a Phillips head screw, a flathead screw, a frearson screw, or any other type of screw head that will allow a user to rotate the elevating screw using a device such as a screwdriver.

Figure 4:
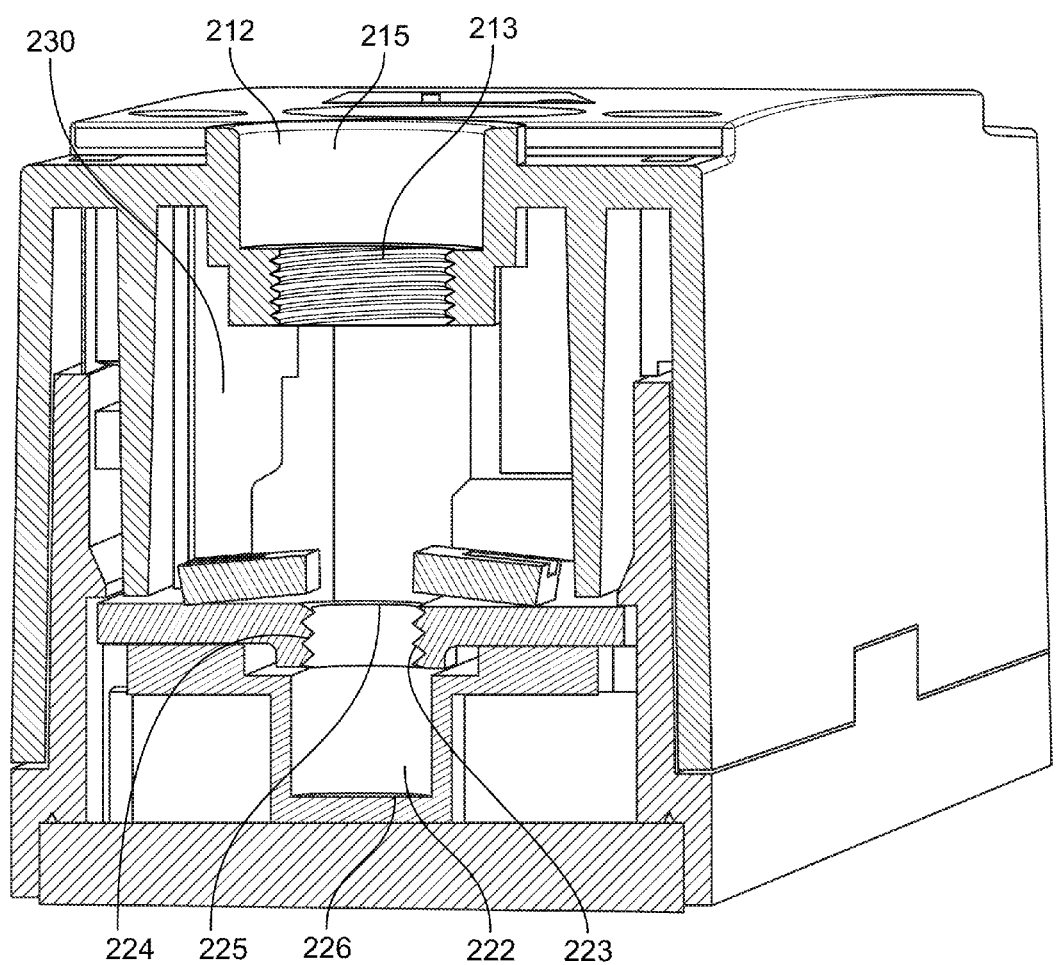
FIG. 4 is a side view of an illustrative solid state relay with an elevating screw removed.

As shown in FIG. 4, the first portion of the housing 210 may further define a bore 212. The bore 212 may define a channel 215 from the exterior of the first portion of the housing 210 into the recess 230. This bore 212 may define a generally cylindrical channel 215, but may also be of any combination of size and shape. The bore 212 may be configured to receive the first end 410 of the elevating screw 400. In certain embodiments the bore 212 may be of a sufficient cross-sectional area to allow the insertion of an object, such as a screwdriver or drill bit, into the bore 212, where it may, among other things, engage with an elevating screw 400. It should be noted that the cross-sectional area through the bore 212 does not need to be uniform. For example, the exterior end of the bore 212 may have an exterior diameter, where the bore then tapers inward to an interior end having a smaller diameter. As another illustrative example, the bore 212 may be shaped to define one or more steps that reduce the diameter (or, for non-circular/cylindrical shaped bores, reduce the width of the bore).

Figure 6:
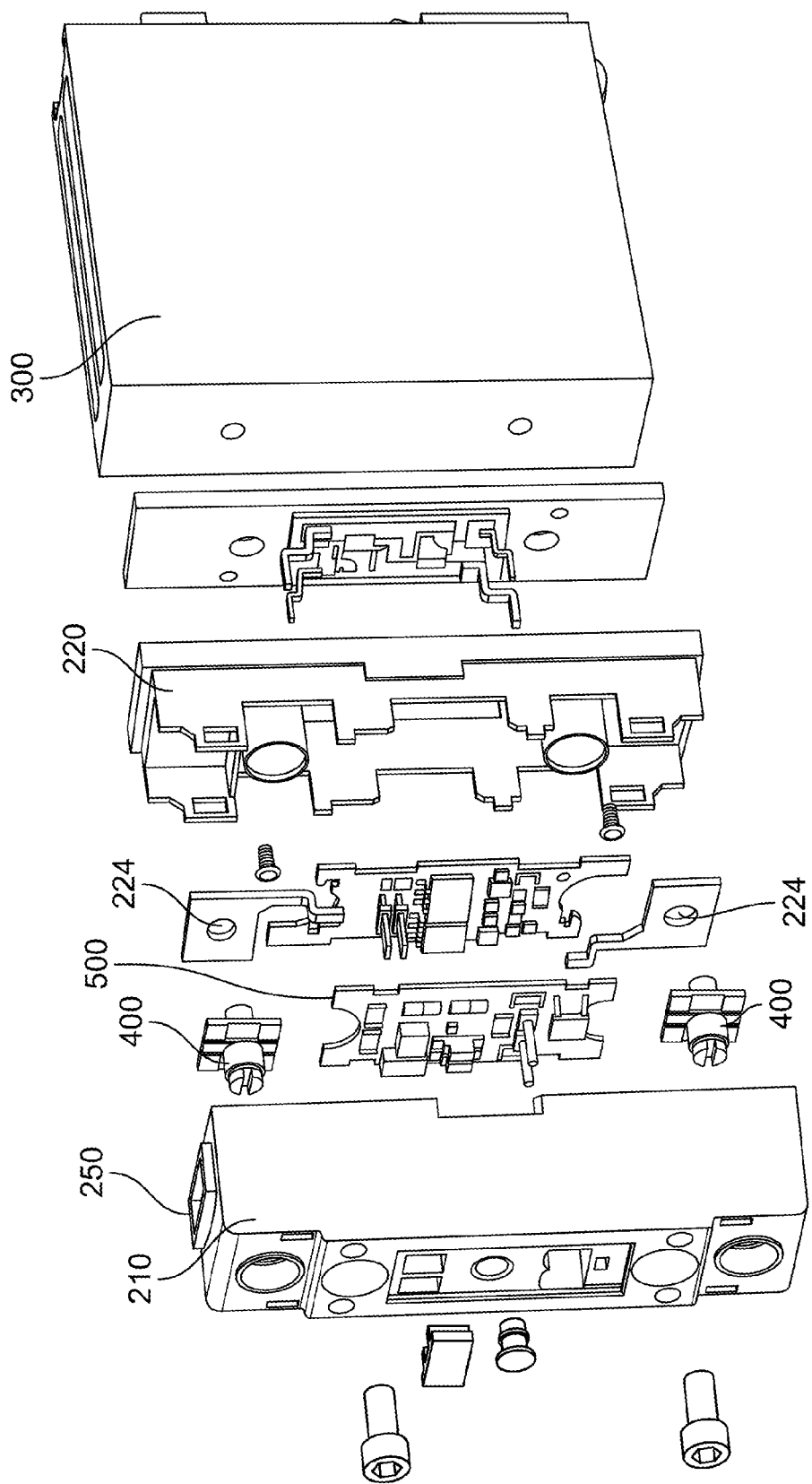
FIG. 6 is a perspective view of an illustrative modular packaging with the components separated.

The second portion of the housing 220 may further define an aperture 222. The aperture 222 may define a slot with first end 225 having an opening generally positioned facing the recess 230 and a second end 226 positioned away from the recess 230. The aperture 222 may be configured to receive the second end 420 of the elevating screw. In certain embodiments the slot may be generally cylindrical, but in other embodiments the slot may be any combination of shape and size. The cross-sectional area of the aperture 222 does not need to be uniform. As shown in FIGS. 4 and 6, in certain embodiments the aperture 222 will be further defined by the terminal connection 224.

In certain embodiments the bore 212 may further include an internal threading 213. As shown in FIG. 2, the internal threading 213 may have a lead and pitch distance designed to receive the external threading 412 of the first end 410 of the elevating screw 400. In certain embodiments the internal threading 213 may span the length of the bore 212, and in other embodiments the internal threading 213 may only span a portion of the bore 212. In certain embodiments the internal threading 213 may span a majority of the length of the bore 212, but in other embodiments may span a minority of the length of the bore 212. In further embodiments the internal threading 213 may span a half, a third, a fourth, two thirds, or three-fourths the length of the bore 212. In certain embodiments internal threading 213 will be defined in the housing itself. For example, in some embodiments, the housing is a thermoplastic, and the threading 213, among other features, is defined in the plastic via an injection molding process using an appropriately shaped mold. In other examples, the threading 213 is added to the housing material by an additional machining process.

Figure 3:
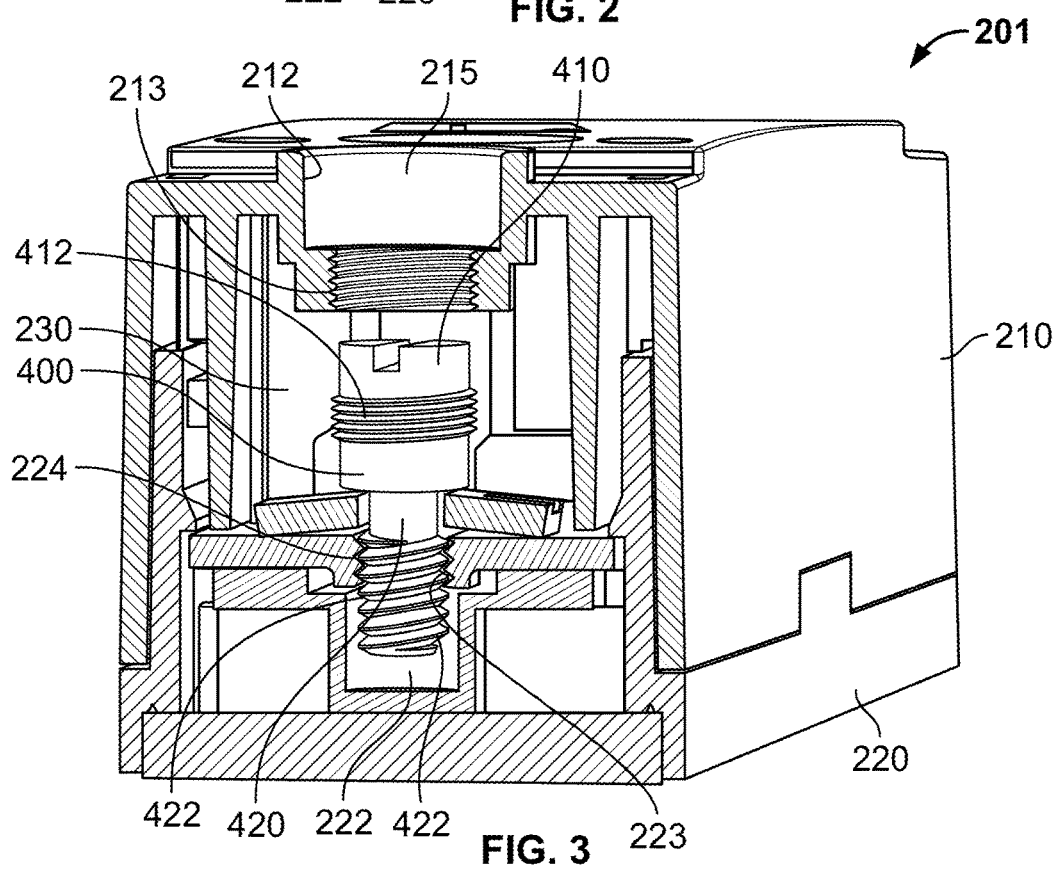
FIG. 3 is a side view of an illustrative solid state relay showing an elevating screw in a second position.

In certain embodiments the aperture 222 may further include an internal threading 223. As shown in FIG. 3, the internal threading 223 may have a lead and pitch distance designed to receive the external threading 422 of the second end 420 of the elevating screw. In certain embodiments the internal threading 223 may span the length of the aperture 222, but in other embodiments the internal threading 223 may only span a portion of the aperture 222. In certain embodiments the internal threading 223 may span a majority of the length of the aperture 222, but in other embodiments may span a minority of the length of the aperture 222. In further embodiments the internal threading 223 may span a half, a third, a fourth, two thirds, or three-fourths the length of the aperture 222. In some embodiments the internal threading 223 may only span the terminal connection 224. In certain embodiments the internal threading 223 may be machine formed into the metal of the terminal connection 224. In certain embodiments internal threading 223 will be defined in the housing itself. For example, in some embodiments, the housing is a thermoplastic, and the threading 223 among other features, is defined in the plastic via an injection molding process using an appropriately shaped mold. In other examples, the threading 223 is added by an additional machining process.

In certain embodiments the elevating screw 400 may be selectively altered between a first position and a second position. As shown as an example in FIG. 2, in the first position the external threading 412 of the first end 410 of the elevating screw 400 will engage with the internal threading 213 of the bore 212. In certain embodiments, the first position will create a gap 240 between the second end 420 of the elevating screw 400 and the second end 226 of the aperture. In the second position, shown as an example in FIG. 3, the external threading 422 of the second end 420 of the elevating screw 420 will engage with the internal threading 223 of the aperture 222.

In certain embodiments the first position of the elevating screw 400 will create a gap 240 of sufficient dimensions to install cabling within the function module. The installation of cabling may include the installation or connection of differing wiring combinations. This may also include the installation of bare wires, solder coated wires, wire terminals, and/or one of more other electrical wiring connections. Examples of terminals include ring terminals, blade terminals, ferrules, or any other device capable of providing an electrical connection. In certain embodiments the dimensions would be sufficient to allow for the installation of cabling and the removal or replacement of cabling, including the removal or replacements of terminals.

In certain embodiments the movement of the elevating screw 400 from the first position to the second position acts as a stabilizing mechanism to hold the cabling in place. After the cabling has been inserted while the elevating screw is in the first position, the movement of the elevating screw between the first position and second position will act as a tightening mechanism, reducing the gap 240 between the second end 420 of the elevating screw 400 and the second end 226 of the aperture 222. In certain embodiments, the second position of the screw will reduce the gap 240 to sufficiently small dimensions such that the cabling, which may include wiring or terminals, is secured in its location. In further examples, as the elevating screw 400 moves between a first position and a second position, there may be intermediate positions between the first position and the second position where the gap 240 is sufficiently small to secure the cabling and the elevating screw 400 is secured in its position. In different embodiments the position of the elevating screw 400 that is sufficient to secure the cabling will depend on the amount of cabling installed in the apparatus, and may be any position where the external threading 422 of the second end 420 of the elevating screw 400 is engaged with the internal threading 223 of the aperture 222.

In certain embodiments the elevating screw 400 may have an associated captured washer, or a washer otherwise connected to the elevating screw 400. In certain embodiments the washer may be assembled into the screw, such as being captured at a portion of the elevating screw 400 between the external threading 412 on the first end 410 and the external threading 422 on the second end 420. In certain embodiments the washer may be capable of limited horizontal movement. In different embodiments this horizontal movement may be limited to $1/10^{th}$ of an inch, $1/50^{th}$ of an inch, or any other limiting dimension. In certain embodiments the washer is capable of vertical movement. In certain embodiments as the elevating screw is in a first position the washer may be selectively secured in a first location near the first end 410 of the elevating screw 400. In certain embodiments, as the elevating screw 400 is in a second position, the washer may be selectively secured in a second location near the second end 420 of the elevating screw 400.

In certain embodiments the external threading 412 and external threading 422 may be different. External threading 412 may have a smaller threading standard in order to provide a smoother transition between the external threading 412 of the first end of the screw 410 and the plastic internal threading 213 of the bore 212. External threading 422 may have a higher threading standard in order to provide stability when the elevating screw 400 is in the second position and stabilizing the cabling.

Figure 7:
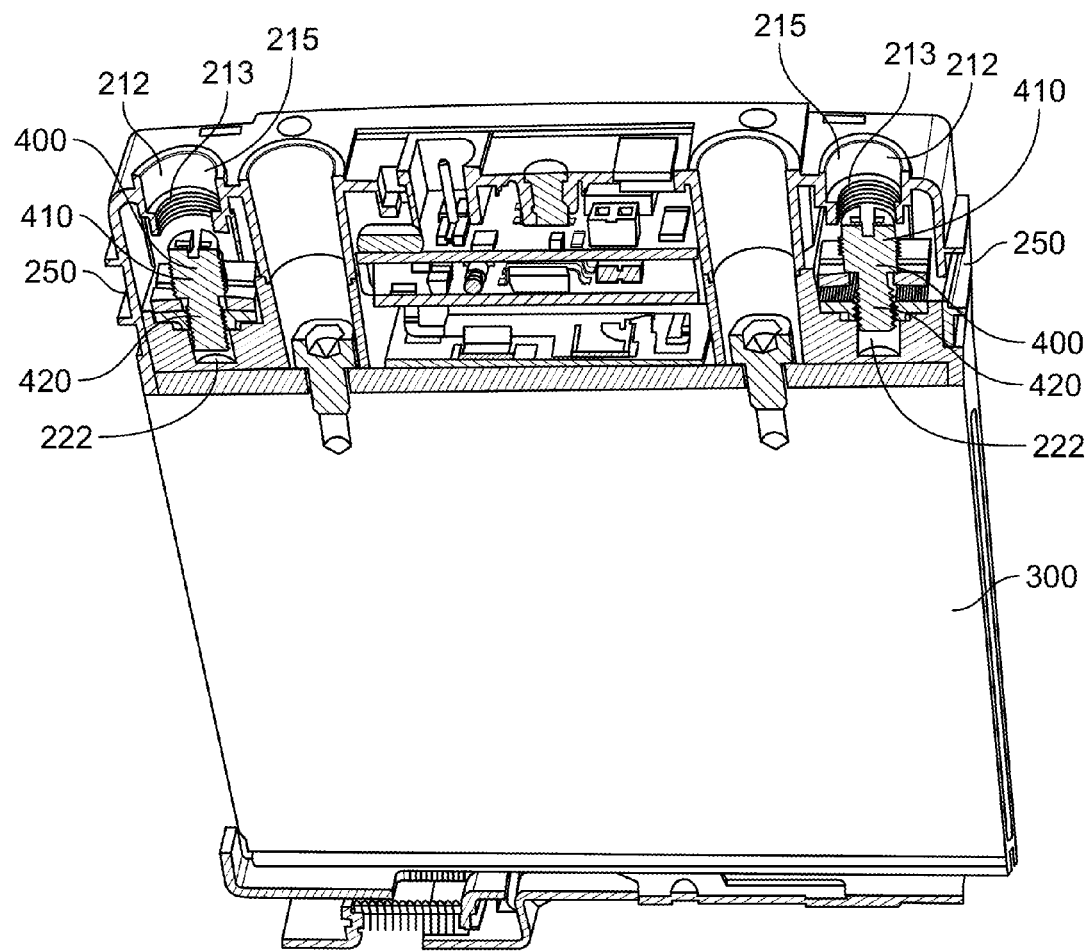
FIG. 7 is a perspective view of an illustrative modular apparatus with the outer portion of the housing removed.

Shown in FIGS. 6 and 7, in certain embodiments the housing may further define a channel 250 spanning from outside the housing into the recess 230. In certain embodiments this channel 250 may allow a user to insert terminals or wiring options from outside the function module into the recess. In some embodiments this channel 250 will allow the user to insert wiring or terminals into the spacing created when the elevating screw 400 is in the first position. As the elevating screw is moved from the first position and into the second position, it will secure the wiring or terminals into place and the elevating screw will be in a position where it blocks the channel 250 such that nothing else can be inserted into the recess through the channel 250.

Current modular packagings of this type use a screw having a single threading to tighten and provide stabilization of the cabling within the module. Installation or removal of cabling, including installation or removal of terminals, may require the single threaded screw to be fully removed. In some cases removing the single threaded screw requires the housing to be completely disconnected. This is an elaborate process that is required for even the smallest change in the cabling. Additionally, because the single threaded screw is not engaged with a second threading while being removed, the single threaded screw can become loose and fall out of the housing. This can cause issues as the single threaded screw could potentially fall into the surrounding environment, such as an electrical cabinet including a plurality of electrical connections. As such, the single threaded screw could be lost within the cabinet, become trapped within a component installed within the cabinet, or even cause an electrical short if the single threaded screw comes in contact with an exposed electrical connection.

A key benefit of certain embodiments over existing designs is that an elevating screw 400 allows for the installation of cabling without requiring the disconnection of a housing (e.g., an SSR, a function module housing, a safety or protection cover, etc.). Because the elevating screw 400 is retained in the housing at both a first position and a second position, the installation of cabling may occur while the elevating screw is still retained within the housing and the first portion of the housing 210 and second portion of the housing 220 remain coupled. In further examples, the elevating screw 400 may be at least partially retained in any intermediate position between the first and second position, as at least some of either external threading 412 or external threading 422 is engaged with the housing. A user wishing to install cabling does not need to disconnect and remove the housing to move the elevating screw 400 into a first position, shown as an example in FIG. 2. While the elevating screw 400 is in the first position there is sufficient spacing to allow the installation of cabling, including wiring and terminals.

When the desired cabling combination has been installed, the elevating screw may be moved into a second position, shown as an example, in FIG. 3. While the elevating screw is in the second position it may act as a tightening mechanism and secure the cabling configuration.

In certain embodiments external threadings 412 and 422 may be different. This may include differing pitch sizes, lead sizes, major diameters, or minor diameters. Different embodiments that contain external threadings with differing pitch sizes would move with different linear velocities when engaging a corresponding internal threading and moving at the same angular velocity. An elevating screw having two external threadings with differing pitch sizes would be unable to engage both corresponding internal threadings at the same time and move in a linear direction without causing deformation and damage to the internal threadings. Therefore, in certain embodiments the length of the elevating screw 400, and the lengths of external threadings 412 and 422 may be sufficient such that as the elevating screw 400 is moved between the first position and the second position, the external threading 412 of the first end 410 of the screw becomes unengaged with the internal threading 213 of the bore 212 at essentially the same position that the external threading 422 of the second end 420 of the screw becomes engaged with the internal threading 223 of the aperture 222. In other embodiments, as the elevating screw 400 is moved between the first position and the second position, the external threading 422 of the second end 420 of the screw may become engaged with the internal threading 223 of the aperture 222 slightly before the external threading 412 of the first end 410 of the screw 400 becomes unengaged with the internal threading 213 of the bore 212.

Manufacturing imperfections will create slight differences even in corresponding threadings. In certain embodiments the internal threading 213 of the bore 212 and the internal threading 223 of the aperture 222 may be made of a material capable to being slightly deformed. In some embodiments this deformation may be up to $\frac{1}{50}^{th}$ of an inch per inch. This will allow the housing (e.g., an SSR, a function module, a safety cover, etc.) to account for these manufacturing imperfections without damaging the function module.

Figure 8:
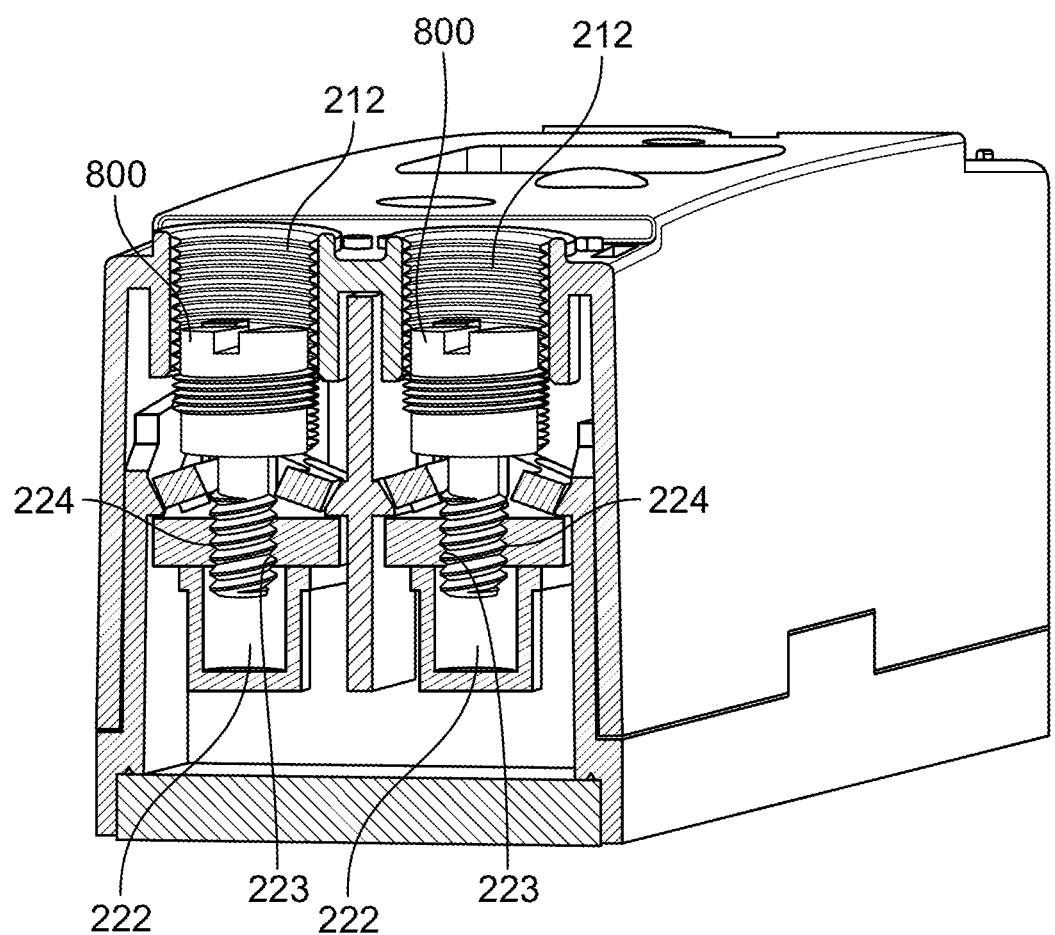
FIG. 8 is a side view of an illustrative solid state relay having a first elevating screw and a secondary elevating screw both shown in a first position.

As shown in FIG. 7, in some embodiments there will be more than one elevating screw in the housing. The elevating screws may be located at different positions within the housing. As further shown in FIG. 8, in certain embodiments there may be more than one elevating screw 800 on either side of the housing.

Figure 9:
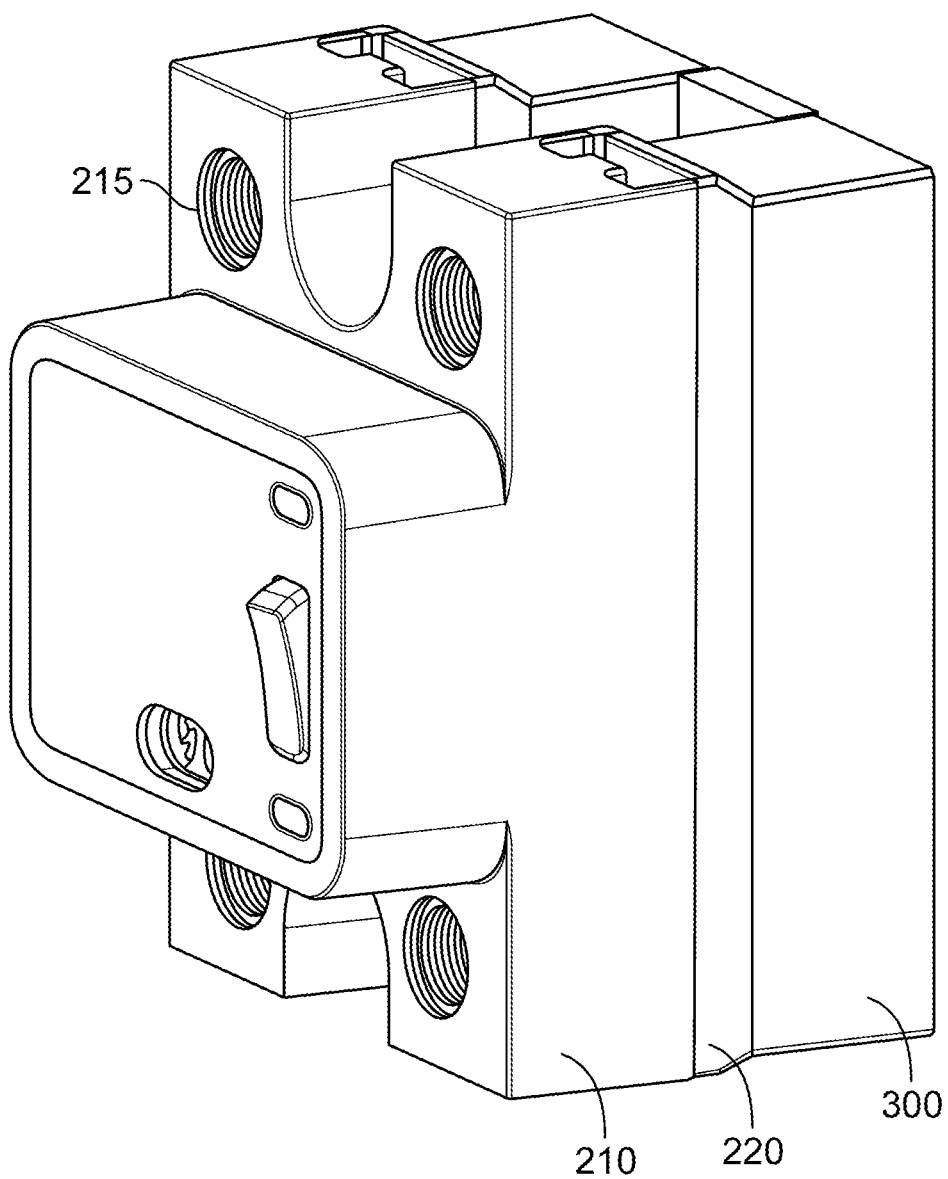
FIG. 9 is a perspective view of another illustrative modular packaging with a relay.

As shown in FIG. 9, in some embodiments the SSR may be a hockey puck style relay. In some embodiments the function module will be of a corresponding shape to the hockey puck style relay in order to provide a more stable connection with the relay.

Figure 10:
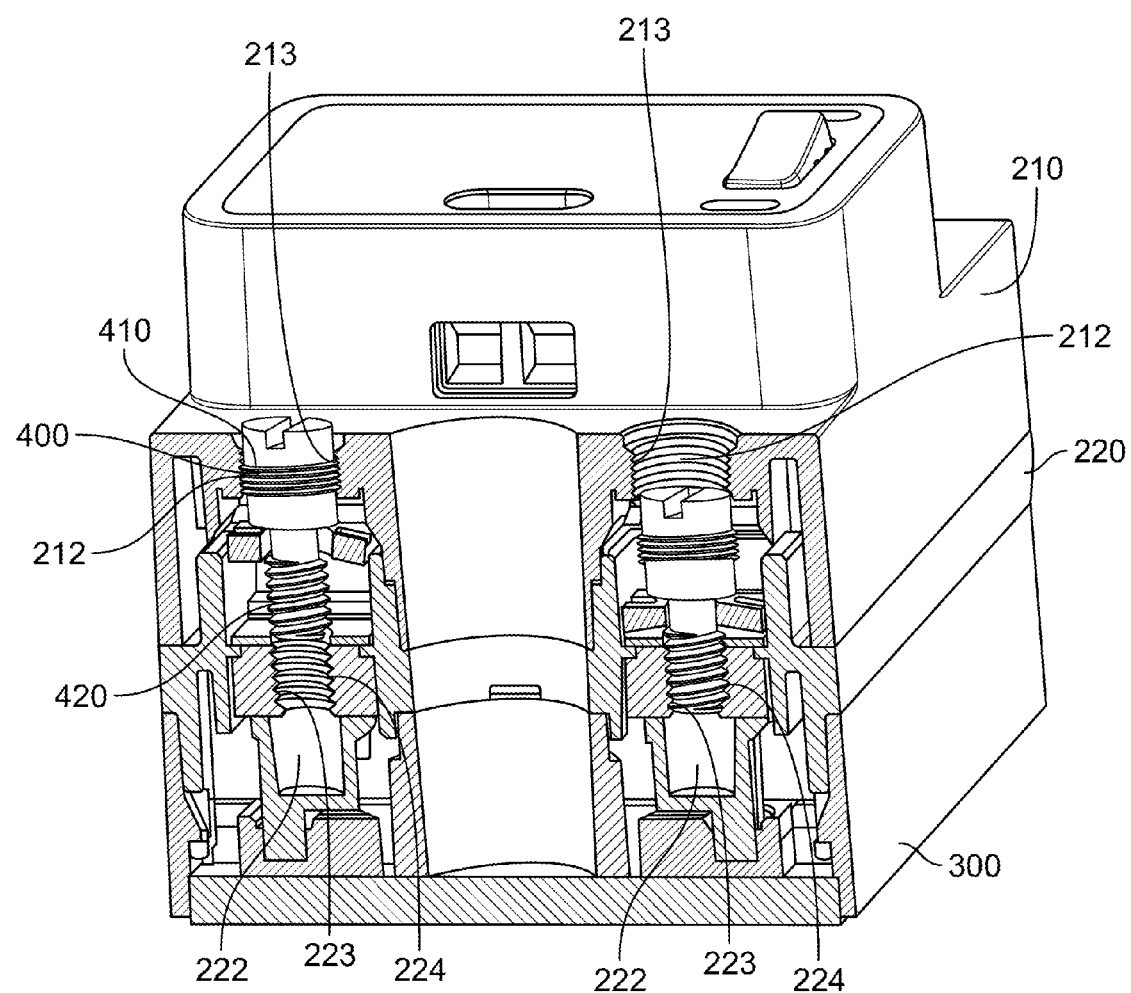
FIG. 10 is a side view of another illustrative modular packaging showing two elevating screws in different positions.

As shown in FIG. 10, in some embodiments the SSR may be a hockey puck style relay and the housing may include more than one elevating screw. Additionally, as shown in FIG. 10, the elevating screws may be selectively altered between locations independently, such that a first elevating screw may generally be secured in a first position while the second elevating screw may generally secured in a second position.

In certain embodiments the function module and SSR may be made of a plastic material, including polycarbonates. In certain other embodiments the function module and SSR may be made of a resin, glass, elastomer, or additional polymer. It is beneficial for the function module and SSR material to meet the requirements of a number of internationally recognized safety standards and/or regulations, such as by having good flammability characteristics. In some embodiments the material would be self-extinguishable and therefore the flame does not propagate. The material should be capable of being injection molded. In certain embodiments the material will be injected to create threadings within the bore and the aperture. Preferred materials would have adequate shear strengths, and good fatigue when heated, such as to a UL 94V-0 grade. In certain embodiments the materials would be capable of being subjected to vibrational loading from 0-500 Hz, accelerations up to 100 m/s$^2$, and temperature gradients up to 120° C. In certain embodiments the materials may be preconditioned from −60° C. to 150° C. In other embodiments the materials may be preconditioned from −50° C. to 140° C. In other embodiments the materials may be preconditioned from −40° C. to 120° C.

In certain embodiments a function module that may be associated with an SSR may be used for monitoring a voltage at a terminal of the SSR. Such function modules may contain a visual indicator and/or a voltage recognition device. The voltage recognition device may include an input device (e.g., a button, a switch, a rotary switch, a potentiometer, etc.) that may allow a user to input one or more threshold values (e.g., voltage levels) and/or an acceptable range of voltage levels where the function module and SSR are operating at ideal conditions. The voltage recognition device may be electronically connected to a visual indicator to provide an indication of a voltage level that is being monitored at an SSR terminal. In certain embodiments the visual indicator may be a numeric display, a light source, such as a light-emitting diode ("LED"), or incandescent bulb, or other device capable of providing a visual indication. When the voltage recognition device determines that the voltage between the SSR and function module is within the range, the voltage recognition device may send a signal to the visual indicator to emit a display that the voltage is within the given range. If the voltage recognition device determines that the voltage between the SSR 201 and function module 202 is not within the given range, the voltage recognition device will provide a signal to the visual indicator to emit a display that the voltage is not within the given range. In certain embodiments the visual indicator may display a color, such as green, when the voltage is within the correct range, and another color, such as red, when the voltage is not within the correct range. It should be noted that these displays may be anything capable of providing an indication to a user whether the voltage is within the given range. In certain embodiments the function module may also contain an alarm output that may go off if the voltage is outside of the correct range.

A benefit of the visual indicator is it allows the modular apparatus to be monitored without being taken apart or manually tested. As mentioned, disconnecting the function module and taking apart the housing can be a difficult and tedious process. Being forced to disconnect the function module exposes the wiring and cabling. This presents potential danger to a user, as well allowing foreign objects to potentially enter and disrupt the connectivity between the function module and SSR. Installing a visual indicator within the function module provides the benefit of real time monitoring without the pitfalls of manual testing. Further, because the visual indicator can be seen at all times, a user can be informed of any type of malfunction without performing any testing or maintenance. This will improve the product's lifespan and overall functionality.

The present disclosure is disclosed above and in the accompanying drawings with reference to a variety of examples. The purpose served by the disclosure, however, is to provide examples of the various features and concepts related to the disclosure, not to limit the scope of the disclosure. One skilled in the relevant art will recognize that numerous variations and modifications may be made to the examples described above without departing from the scope of the present disclosure. Moreover, any of the features discussed in reference to any particular embodiment may be features of any other embodiments of the apparatus described above, and vice versa.

What is claimed is:

1. A modular apparatus, comprising:
a solid state relay comprising an exterior housing, the housing comprising a first portion generally defining a recess and further defining a bore with an internal threading, and a second portion detachably coupled to the first portion and defining an aperture with an internal threading, wherein the exterior housing encloses a first printed circuit board having at least a first input terminal and at least a first output terminal;
at least one function module removably coupled to the solid state relay;
at least a first elevating screw, the elevating screw having a first end and a second end, the first end comprising a first diameter and a first external threading that is compatible with the internal threading of the bore, and the second end comprising a second diameter and a second external threading that is compatible with the internal threading of the aperture; and,
wherein the elevating screw is configured to be selectively altered between a first position where the first external threading of the elevating screw is engaged with the internal threading of the bore, and a second position where the second external threading of the elevating screw is engaged with the internal threading of the aperture.

2. The modular apparatus of claim 1, wherein the first position of the elevating screw provides sufficient spacing between the first end of the elevating screw and the housing for the installation of cabling without disconnecting the second portion of the housing from the first portion of the housing.

3. The modular apparatus of claim 2, wherein the first position of the elevating screw provides sufficient spacing between the first end of the elevating screw and the housing such that a terminal may be installed or replaced.

4. The modular apparatus of claim 3, wherein the first external threading of the elevator screw is designed to 8-32 UNC standards and the second external threading of the elevator screw is designed to ¼-40 UNS standards.

5. The modular apparatus of claim 4, wherein the internal threading of the aperture and the internal threading of the bore are capable of being deformed up to 1/100th of an inch per inch.

6. The modular apparatus of claim 1, wherein the solid state relay and function module are removably coupled by a mechanical retaining mechanism.

7. The modular apparatus of claim 1, wherein the internal threading of the bore spans only a portion of the bore's length.

8. The modular apparatus of claim 1, wherein the internal threading of the aperture spans only a portion of the aperture's length.

9. The modular apparatus of claim 1, wherein the modular apparatus comprises a plastic material, resin, a plastic composite, or combinations thereof.

10. The modular apparatus of claim 1, wherein the modular apparatus conforms to an International Protection standard of IP20.

11. The modular apparatus of claim 1, further comprising:
a second printed circuit board enclosed in the solid state relay housing; and,
a spring operated sensing device configured to selectively establish electrical conductivity between the first printed circuit board and the second printed circuit board.

12. The modular apparatus of claim 1, further comprising:
a visual indicator and a voltage recognition device, where the voltage recognition device is configured to receive an input range of voltages, recognize the actual voltage between the terminals of the solid state relay, and send to the visual indicator a signal with a first value if the actual voltage is within the input range or send to the visual indicator a signal with a second value if the actual voltage is not within the input range.

13. The modular apparatus of claim 12, wherein the visual indicator is configured to emit a first display if it receives a signal with the first value and to emit a second display if it receives a signal with the second value.

14. The modular apparatus of claim 13, wherein the visual indicator is a light-emitting diode, wherein first display is a green lighting and the second display is a red lighting.

15. A modular apparatus, comprising:
a solid state relay comprising an exterior housing, the housing comprising a first portion generally defining a recess and further defining a bore with an internal threading, and a second portion detachably coupled to the first portion and defining an aperture with an internal threading, wherein the solid state relay housing encloses a first printed circuit board having at least a first input terminal and at least a first output terminal;
at least one function module removably coupled to the solid state relay;
at least one elevating screw, wherein the elevating screw is configured to be selectively altered between a first position where the first end of the elevating screw is engaged with the first portion of the housing, and a second position where the second end of the elevating screw is engaged with the second portion of the housing; and,
wherein the first position of the elevating screw provides sufficient spacing between the second end of the elevating screw and the housing for the installation of cabling.

16. The modular apparatus of claim 15, wherein the installation of cabling includes the installation of removal of a terminal.

17. The modular apparatus of claim 15, further comprising:
a bore having an internal threading compatible to receive the first threading of the first end of the elevating screw, and an aperture having an internal threading compatible to receive the second threading of the second end of the elevating screw.

18. The modular apparatus of claim 15, further comprising:
a second printed circuit board enclosed in the function modular housing; and,
a spring operated sensing device configured to selectively establish electrical conductivity between the first printed circuit board and the second printed circuit board.

19. The modular apparatus of claim 15, further comprising:
 a visual indicator and a voltage recognition device, where the voltage recognition device is configured to receive an input range of voltages, recognize the actual voltage between the terminals of the solid state relay, and send the visual indicator a first signal if the actual voltage is within the input range or send the visual indicator a second signal if the actual voltage is not within the input range.

20. The modular apparatus of claim 19, wherein the visual indicator is configured to emit a first display if it receives a signal with the first value and to emit a second display if it receives a signal with the second value.

\* \* \* \* \*